(12) United States Patent
McCormack

(10) Patent No.: US 6,577,655 B2
(45) Date of Patent: Jun. 10, 2003

(54) CONTROL CIRCUIT FOR A RADIATION SOURCE, APPARATUS COMPRISING THE CONTROL CIRCUIT, OPTICAL TRANSMITTER COMPRISING THE CONTROL CIRCUIT, AND METHOD FOR CONTROLLING A RADIATION SOURCE

(75) Inventor: James Joseph Anthony McCormack, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 170 days.

(21) Appl. No.: 09/778,277

(22) Filed: Feb. 7, 2001

(65) Prior Publication Data

US 2002/0114242 A1 Aug. 22, 2002

(30) Foreign Application Priority Data

Feb. 9, 2000 (EP) .............................. 00200424

(51) Int. Cl.⁷ ................................. H01S 3/13
(52) U.S. Cl. ..................... 372/29.021; 372/29.014; 372/29.02
(58) Field of Search ......................... 372/29.021, 29.02, 372/29.011, 31, 29.014, 29.015

(56) References Cited

U.S. PATENT DOCUMENTS

| | | | |
|---|---|---|---|
| 4,796,267 A | 1/1989 | Yamada et al. | 372/38 |
| 4,890,288 A * | 12/1989 | Inuyama et al. | 372/29.021 |
| 5,018,154 A | 5/1991 | Ohashi | 372/29 |
| 5,335,239 A | 8/1994 | Herczeg et al. | 372/38 |
| 5,446,716 A * | 8/1995 | Eastman et al. | 369/47.51 |
| 5,978,393 A * | 11/1999 | Feldman et al. | 372/29.021 |
| 6,078,601 A * | 6/2000 | Smith | |

FOREIGN PATENT DOCUMENTS

JP         03099485        4/1991  ........... H01S/3/133

* cited by examiner

Primary Examiner—Albert W. Paladini
(74) Attorney, Agent, or Firm—Michael E. Belk

(57) ABSTRACT

The invention pertains to a control circuit (4) for a radiation source (2). The circuit comprises means (43) for generating an error signal ($P_{err}$) which is indicative for a difference between a measured average value of the output power of the radiation source (2) and a desired average value ($P_{set}$) of the output power of the radiation source. The circuit further comprises combining means (44, 45, 46) for generating a control signal (Sout) for the radiation source (2) in response to said error signal ($P_{err}$) and to an information signal ($S_{in}$) for modulating the radiation source. The combining means comprise first means (44) for modifying the information signal by a multiplicative factor γ which is dependent on the error signal, and second means (45, 46) for modifying the information signal by an additive factor σ which is dependent on the error signal.

10 Claims, 4 Drawing Sheets

CONTROL CIRCUIT FOR A RADIATION SOURCE, APPARATUS COMPRISING THE CONTROL CIRCUIT, OPTICAL TRANSMITTER COMPRISING THE CONTROL CIRCUIT, AND METHOD FOR CONTROLLING A RADIATION SOURCE

BACKGROUND OF THE INVENTION

1. Technical Field

The invention pertains to a control circuit for a radiation source comprising means for generating an error signal which is indicative for a difference between a measured average value of the output power of the radiation source and a desired average value of the output power of the radiation source, combining means for generating a control signal for the radiation source in response to said error signal and to an information signal for modulating the radiation source.

The invention also pertains to an apparatus for reading and/or writing a record carrier comprising the control circuit.

The invention further pertains to an optical transmitter comprising the control circuit.

2. Related Art

The invention further pertains to a method for controlling a radiation source.

From U.S. Pat. No. 4,796,267 a laser controller is known which comprises a negative feedback loop to control an average light quantity level despite variations in temperature. The feedback loop comprises a sensor for generating an output signal which is a measure for the power of radiation of the radiation source, a low-pass filter for low pass filtering the output signal. The feedback loop further comprises a subtractor for generating a difference signal which is a difference between said low-pass filtered signal and a setpoint signal representing the desired average light quantity level. The known circuit maintains the average light quantity level when the temperature changes. However if the temperature changes also the proportionality factor between the control current and the light quantity level of the semiconductor radiation source changes. This implies that the difference between the output levels of the radiation source changes with a changing temperature.

Also control circuits are known which include feedback means which monitor the respective power of the radiation for each modulation level and adapt the control current accordingly. This has the disadvantage that the feedback means require a large bandwidth.

SUMMARY OF THE INVENTION

It is a purpose of the invention to provide a control circuit for a radiation source which is capable of maintaining a plurality of intensity levels at a predetermined value, using a feedback loop with a relatively low bandwidth. It is a further purpose to provide an apparatus for reading and/or writing a record carrier comprising such a control circuit, and an optical transmitter comprising such a control circuit. It is also a purpose to provide a method for controlling a radiation source having this capability. According to the invention the control means comprise first means for modifying the information signal by a multiplicative factor $\gamma$ which is dependent on the error signal, and second means for modifying the information signal by an additive factor $\sigma$ which is dependent on the error signal.

The output power of a laser diode is dependent on temperature (T). The output power (P) may be approximated by $$P=0 \text{ for } I<I_t \tag{1a}$$

$$P=\eta(T)*(I-I_t(T)) \text{ for } I>=I_1 \tag{1b}$$

wherein $I_t$ is a threshold current required for activating the laserdiode and $\eta$ is a slope (relative efficiency). Both the threshold current $I_t$ and the slope $\eta$ are dependent on the temperature. In the control circuit of the invention the information signal is modified by a multiplicative factor $\gamma$ and an additive factor $\sigma$ and both factors are dependent on the error signal. This enables the control circuit to perform each of the different functions such as reading, writing, erasing and preheating at the appropriate power levels despite variations in temperature.

It has been found that for most semiconductor light sources the following relationship exists between the threshold current and the slope:

$$\frac{\eta_0}{\eta} = (1-a) + a\frac{I_{th}}{I_{th0}} \tag{2}$$

Therein $\eta$, $\eta_0$ are the slopes at a temperature and a reference temperature respectively, while $I_{th}$, $I_{th0}$ are the threshold currents at those temperatures and a is a dimensionless constant which is characteristic for each semiconductor light source. The value of this constant usually is within the range of 0.5 to 1.5. Hence in order to compensate at the same time for both the influence of the temperature on the slope and on the required threshold current, in a practical embodiment the multiplicative factor $\gamma$ and an additive factor $\sigma$ are related according to the function $$\gamma = k\sigma + b, \tag{3}$$

wherein $$k = a\frac{\gamma_0}{\sigma_0} \text{ and } b = \gamma_0. \tag{4}$$

Therein $\gamma_0$ and $\sigma_0$ respectively are the values of $\gamma$ and $\sigma$ at a reference temperature.

A control circuit according to the invention can be implemented in different ways. In a first preferred embodiment the additive factor $\sigma$ is linearly dependent on the error signal $P_{err}$, while the multiplicative factor $\gamma$ is computed from $\sigma$ according to the relation 3 above. Such an embodiment of a control circuit according to the invention is characterized in that the first means comprise modification means which calculate a modified error signal from the error signal and multiplication means for generating an intermediate signal which is indicative for the product of the modified error signal and the information signal and in that the second means comprise addition means for generating an output signal which is indicative for the sum of the intermediate signal and the error signal, the output signal being the control signal.

A variant of this preferred embodiment is characterized in that the first means comprise modification means which calculate a modified error signal from the error signal and multiplication means for generating an intermediate signal which is indicative for the product of the modified error signal and the information signal and in that the second means comprise further multiplication means for generating a further intermediate signal which is indicative for a product of the error signal and a further information signal and addition means for generating an output signal which is indicative for the sum of the intermediate signal and the further intermediate signal, the output signal being the control signal. This embodiment provides for an additional degree of freedom for controlling the radiation source.

Likewise a second preferred embodiment is possible in which the multiplicative factor γ is linearly dependent on the error signal. In that case the additive factor σ can be computed from the multiplicative factor γ by the inverse of relation 3. Hence $$\sigma = \frac{1}{k}(\gamma - b) \quad (5)$$

Such a second preferred control circuit according to the invention is therefore characterized in that the first means comprise multiplication means for generating an intermediate signal which is indicative for the product of the error signal and the information signal and in that the second means comprise modification means which calculate a modified error signal from the error signal and addition means for generating an output signal which is indicative for the sum of the intermediate signal and the modified error signal, the output signal being the control signal. Various ways of feedback control are possible such that the multiplicative and the additive component comply with the mutual relation described above. However, in the first and the second preferred embodiment described above one of these two components is directly dependent on the error signal, so that the control means can be implemented in a relatively simple way, e.g. with a relatively small amount of hardware.

A preferred embodiment of the first embodiment of the control circuit according to the invention is further characterized by a node for receiving a signal which is indicative for a measured reflection coefficient of an object which is radiated by the radiation source, by subtraction means for generating a difference signal which is indicative for a difference between a desired reflection coefficient and the measured reflection coefficient, by multiplication means for generating an intermediate signal which is indicative for a product of the difference signal and a signal indicative for a desired power, and addition means for generating a signal which is indicative for the sum of the intermediate signal and a further signal indicative for a desired power.

In practice dust, fingerprints etc. may absorb a part of the radiation from the radiation source, and therewith influence its effect on the record carrier. In this preferred embodiment these influences are compensated for, while at the same time still a good compensation for temperature influences is obtained.

Preferably this embodiment is characterized by multiplication means for generating a product signal which is indicative of a product of the difference signal and the error signal and means for generating an output signal which is indicative for the sum of the product signal and the difference signal. In this way a short response time is obtained.

The controller according to the invention is in particular suitable for application in a recording/playback device using a radiation source. In accordance with the invention therefore a device for recording and/or playback of information on a record carrier includes a controller according to the invention, a radiation source which is controllable by the controller, a sensor for generating a signal which is indicative of an intensity of radiation emitted by the radiation source and which is coupled to an input of the controller, means for mapping the radiation beam at a spot at the information carrier, means for causing a relative displacement between the spot and the record carrier.

The control circuit according to the invention is also very suitable for application in an optical transmitter. An optical transmitter according to the invention therefore comprises:

input means for receiving an input signal, a control circuit according to one of the claims 1 to 7 coupled to said input means, a radiation source controlled by the control circuit measuring means for measuring an amount of radiation generated by the radiation source having an output coupled to the control circuit, means to couple the output of the radiation source into a light conductor.

The invention also pertains to a method for controlling a radiation source comprising determining an error signal which is indicative for a difference between a measured average value of the output power of the radiation source and a desired average value of the output power of the radiation source, generating a control signal for the radiation source by combining said error signal and an information signal representative of information to be written to the radiation source, characterized in that, the step of generating the control signal comprises modifying the information signal by a multiplicative factor γ which is dependent on the error signal, and modifying the information signal by an additive factor σ which is dependent on the error signal.

BRIEF DESCRIPTION OF THE DRAWINGS

These and other aspects of the invention are described in more detail with reference to the figures. Therein FIG. 1 schematically shows a first embodiment of an apparatus according to the invention for reading and/or writing an optical or opto-magnetic record carrier.

DETAILED DESCRIPTION OF THE INVENTION

Figure 1:
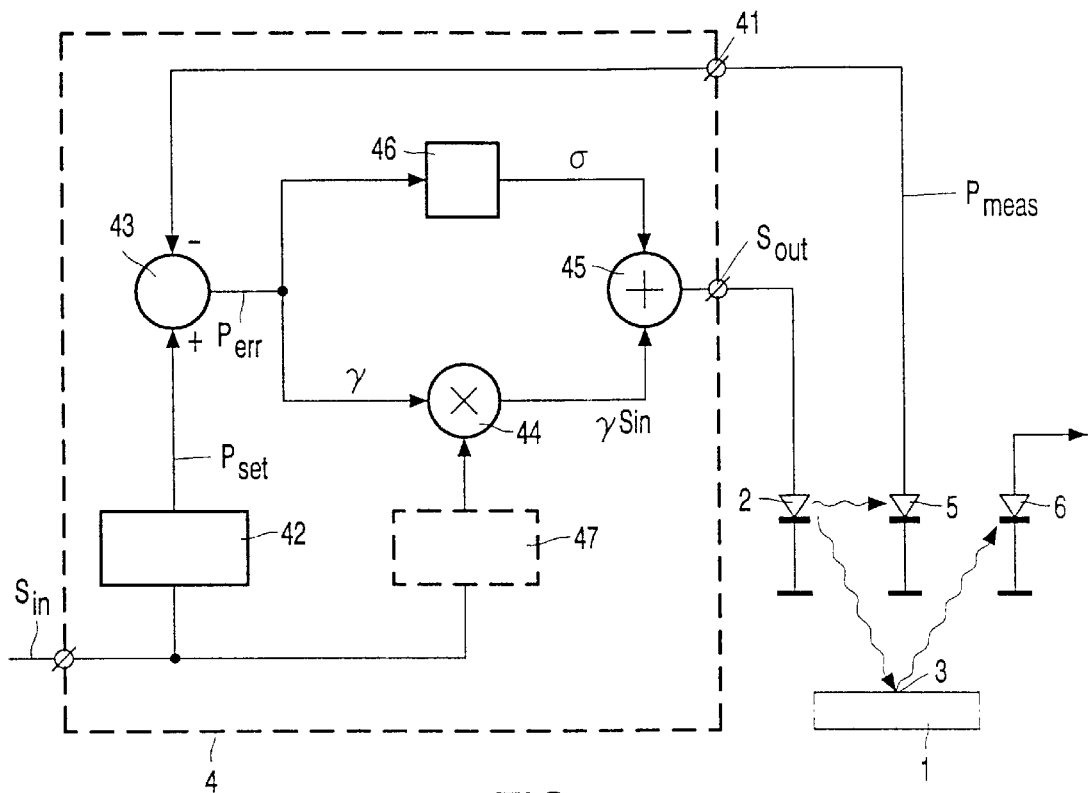

FIG. 1 schematically shows an embodiment of an apparatus for reading and/or writing an optical or opto-magnetic information carrier 1. In the embodiment shown the apparatus is both suitable for reading and writing. The apparatus comprises a radiation source 2, for generating radiation. The apparatus also comprises an optical system for mapping the radiation at a scanning spot 3 at an information carrier and displacing means for displacing the record carrier 1 and the scanning spot 3 with respect to each other. As the optical system and the displacing means are not relevant to the present invention they are not shown, nor described here in detail. The optical system could be of any type known to the person skilled in the art of optical recording and comprise for example one or more optical components such as lenses, mirrors, grids, and holograms. Likewise the displacing means may be implemented in different ways known to the skilled person. For example an apparatus for a disc shaped information carrier may comprise a spindle motor for rotating the record carrier, and displacing means for displacing the radiation spot. The latter may comprise a single stage, in the form of a sledge driven by a linear motor or a rotatable arm driven by a voice coil motor. Preferably the radiation spot displacing means comprise another stage for performing small movements, for example in the form of an actuator for controlling a lens in the optical system. In the case of an optical card, the apparatus may comprise displacing means for longitudinally displacing the card, for example a linear motor or a rotating motor in combination with a transmission system to convert the rotating movement in a linear movement. In a further embodiment the information carrier is an optical tape. In that embodiment the apparatus preferably has a first displacing means for displacing the tape in its longitudinal direction and second displacing means for moving the scanning spot in a direction transverse thereto.

The apparatus shown is provided with a control circuit 4 for the radiation source 3 which comprises means 41, 42, 43 for generating an error signal $P_{err}$ which is indicative for a difference between a measured average value $P_{meas}$ of the output power of the radiation source and a desired average value $P_{set}$ of the output power of the radiation source 3. In the embodiment shown said means comprise input means 41, e.g. an input terminal or a connection for receiving a signal $P_{meas}$ from a light sensitive diode 5, which signal $P_{meas}$ is indicative for a measured output power of the radiation source 2. The means for generating the error signal also comprise setting means 42 for setting a desired average value Pset of the output power of the radiation source, and combination means 43, in this case a subtractor for subtracting the signal $P_{meas}$ from the signal $P_{set}$. The light sensitive diode 5 receives a portion of the radiation of the radiation source 2, for example via a partly reflecting mirror in the optical path from the light source 2 to the information carrier 1. In the embodiment shown the light sensitive diode 5 has a relatively small bandwidth, so that it is not necessary to use a separate low pass filter to filter the output signal of the light sensitive diode 5. The apparatus shown is further provided by detection means 6, for detecting radiation which is reflected by the record carrier 1. The detection means 6 may be used for generating a read signal which is representative of information stored at the record carrier 1. The detection means 6 may comprise a plurality of detectors, which enables a signal processing system known as such to generate a radial error and a focus error signal.

The control circuit further comprises combining means 44, 45, 46 for generating a control signal $S_{out}$ for the radiation source 2 in response to the error signal $P_{err}$ and to an information signal $S_{in}$ representative of information in accordance with which the radiation source 2 is to be modulated.

The combining means comprise first means 44 for modifying the information signal $S_{in}$ by a multiplicative factor $\gamma$ which is dependent on the error signal $P_{err}$. The information signal $S_{in}$ may be further modified by a write strategy puls generator 47 which generates one or more pulses for each information symbol in the information signal. The combining means further comprise second means 45 for modifying the information signal $S_{in}$ by an additive factor $\sigma$ which is dependent on the error signal $P_{err}$.

In the embodiment shown the setting means 42 determine the desired average value $P_{set}$ of the power from the information signal $S_{in}$. If the desired average value $P_{set}$ of the power is constant, however, the setting means 42 may be in the form of a register containing said constant value.

The multiplicative factor $\gamma$ and the additive factor $\sigma$ are related according to the function $$\gamma = k\sigma + b$$

In the embodiment shown the first means 44 comprise a multiplier for generating an intermediate signal $\gamma S_{in}$ which is indicative for the product of the error signal $P_{err}$ and the information signal $S_{in}$ and in that the second means 45, 46 comprise modification means 46 which calculate a modified error signal $\sigma$ from the error signal $P_{err}$ and addition means 45 for generating an output signal $S_{out}$ which is indicative for the sum of the intermediate signal $\gamma S_{in}$ for and the modified error signal $\sigma$. The output signal is the control signal $S_{out}$ for the radiation source.

Figure 2:
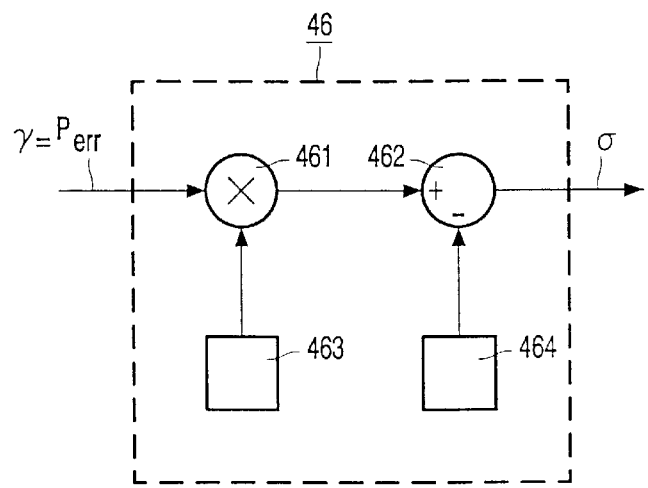
FIG. 2 shows a portion of the apparatus of FIG. 1 in more detail, FIG. 3 schematically shows a second embodiment of an apparatus according to the invention.

The modification means 46 are shown in more detail in FIG. 2. The modification means comprise a multiplier 461, an adder 462, a first register 463 and a second register 464. The first and the second register respectively contain the values:

$$\frac{1}{a}\frac{\sigma_0}{\gamma_0} \quad \text{and} \quad \frac{a-1}{a}\sigma_0$$

Hence the output signal $\sigma$ of the modification means 46 complies with $$\sigma = \frac{1}{a}\frac{\sigma_0}{\gamma_0}\gamma + \frac{a-1}{a}\sigma_0 \tag{6}$$

Figure 3:
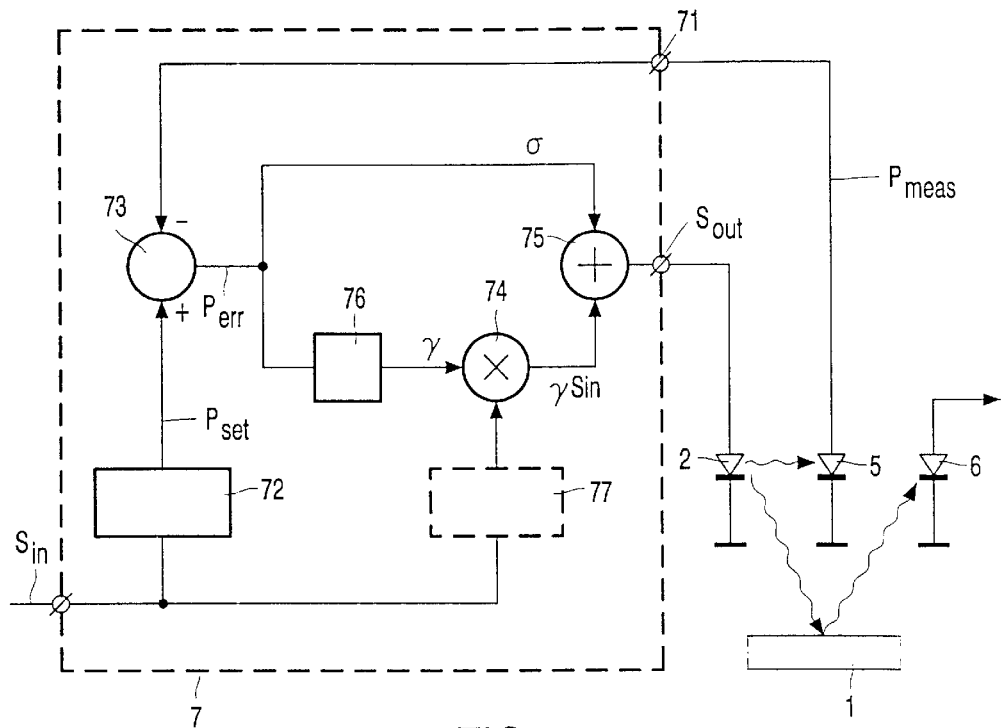

FIG. 3 shows a second embodiment of a control circuit 7 according to the invention. In FIG. 3 parts having the same reference numerals as in FIG. 1 correspond to each other. Furthermore, the parts 71, 72, 73 correspond to parts 41, 42, 43 in FIG. 1. The optional part 77 corresponds to the optional part 47. In the embodiment shown in FIG. 3 the first means 74, 76 comprise modification means 76 which calculate a modified error signal $\gamma$ from the error signal $P_{err}$. The first means further comprise multiplication means 74 for generating an intermediate signal $\gamma S_{in}$ which is indicative for the product of the modified error signal $\gamma$ and the information signal $S_{in}$. The second means 75 comprise an adder for generating an output signal $S_{out}$ which is indicative for the sum of the intermediate signal $\gamma S_{in}$ and the error signal $P_{err}$, the output signal $S_{out}$ being the control signal.

Figure 4:
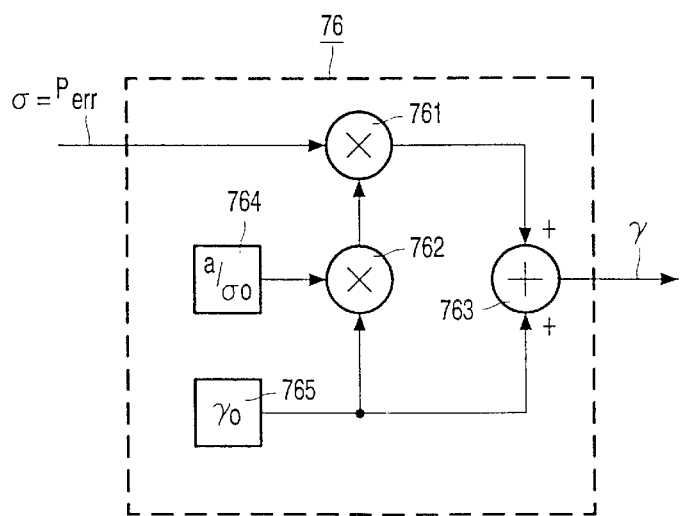
FIG. 4 shows a portion of the apparatus of FIG. 3 in more detail.

The modification means 76 are shown in more detail in FIG. 4. The modification means 76 comprise a first and a second multiplier 761, 762, an adder 763, and a first and a second register 764, 765. The first register 764 contains the value $$\frac{a}{\sigma_0}$$

and the second register contains the value $\gamma_0$.

The modified error signal γ complies with:

$$\gamma = \gamma_0 + \frac{a\gamma_0}{\sigma_0}\sigma \quad (7)$$

Figure 5:
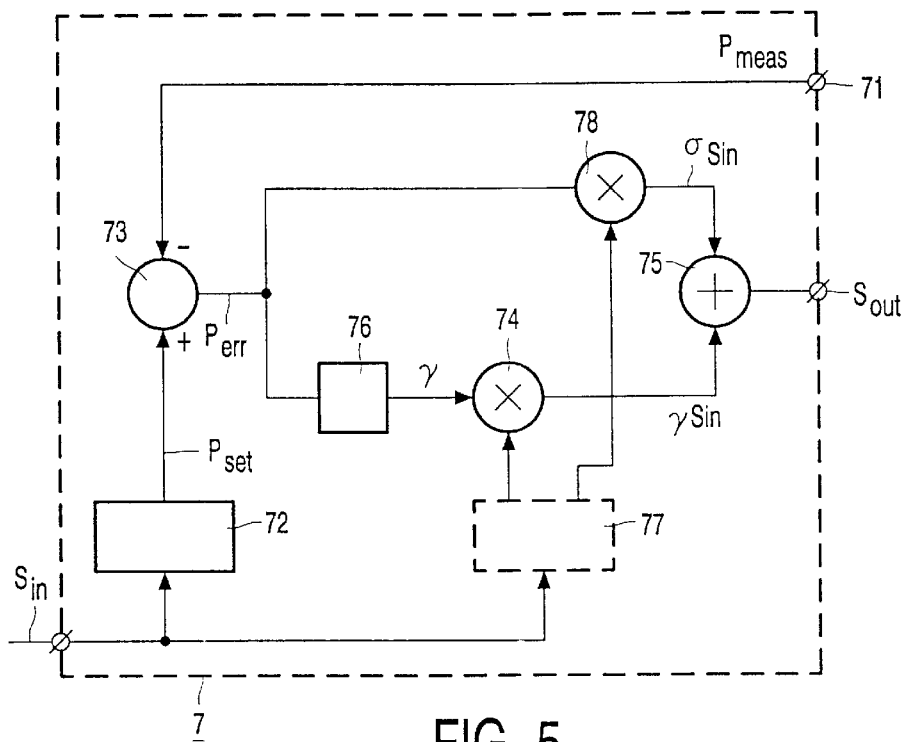
FIG. 5 shows an embodiment of a control circuit according to the invention.

A modification of the embodiment of FIG. 3 is shown in FIG. 5. Mutually corresponding parts in those Figures have the same reference numerals. In FIG. 5 the second means 75, 78 comprise further multiplication means 78 for generating a further intermediate signal $\sigma S_{in}$ which is indicative for a product of the error signal $P_{err}$ and a further information signal.

Figure 6:
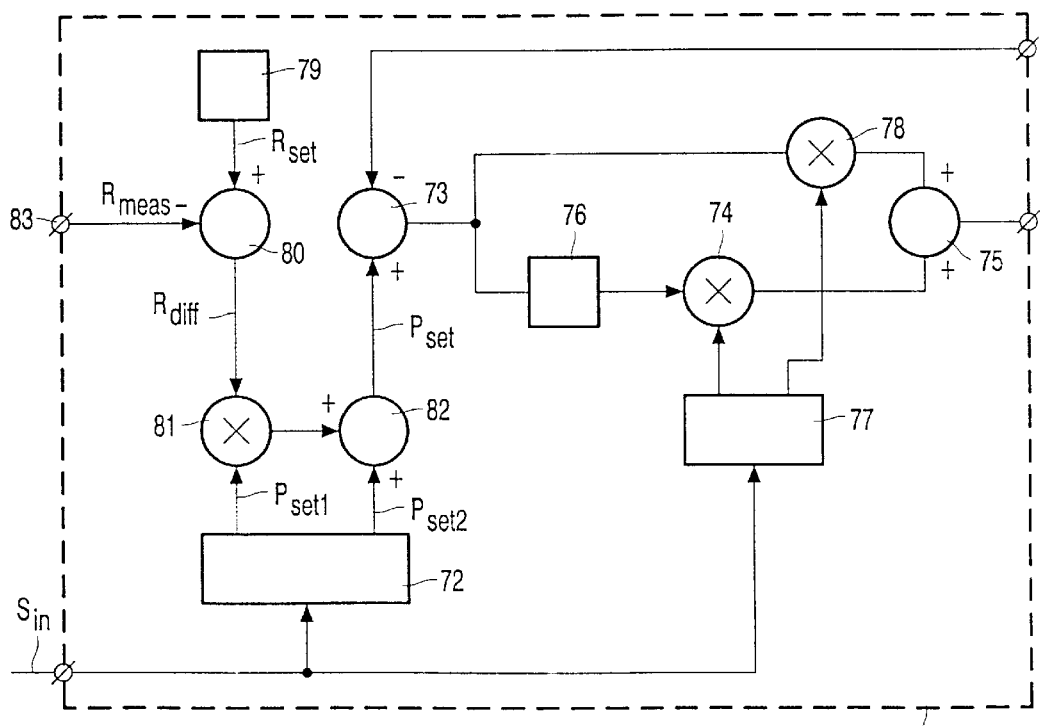
FIG. 6 shows a further embodiment of a control circuit according the invention.

Another modification of that embodiment of the control circuit 7 according to the invention is shown in FIG. 6. Said modification is characterized by a node 83 for receiving a signal $R_{meas}$ which is indicative for a measured reflection coefficient of an object which is radiated by the radiation source 2. The modified embodiment further comprises subtraction means 80 for generating a difference signal $R_{diff}$ which is indicative for a difference between a desired reflection coefficient $R_{set}$ and the measured reflection coefficient $R_{meas}$. The control circuit 7 has multiplication means 81 for generating an intermediate signal which is indicative for a product of the difference signal $R_{diff}$ and a signal indicative for a desired power $P_{set1}$. The control circuit also has addition means 82 for generating a signal $P_{set}$ which is indicative for the sum of the intermediate signal and a further signal $P_{set2}$ indicative for a desired power. The signal Pset2 is a measure for the minimum supply current required to activate the radiation source. The signal Pset1 is a measure for an additional current required to obtain the desired power.

In an implementation of the embodiments of FIGS. 5 and 6 the modification means 76 are the modification means shown in FIG. 4 and the value of the register 765 is equal to the signal $R_{diff}$. In that embodiment the multiplication means 762 and 761 generate a product signal which is indicative of a product of the difference signal and the error signal. The adder 763 serves as means for generating an output signal which is indicative for the sum of the product signal and the difference signal Rdiff.

Figure 7:
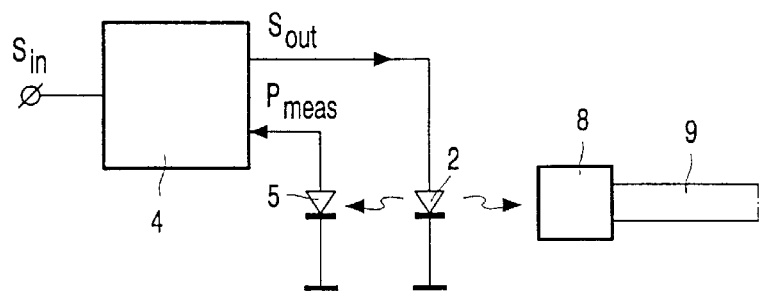
FIG. 7 shows an optical transmitter according to the invention.

FIG. 7 schematically shows an optical transmitter. The transmitter comprises input means for receiving an input signal $S_{in}$. The transmitter further comprises a control circuit 4 according to the invention, for example as shown in FIG. 1 which is coupled to said input means. The transmitter also comprises a radiation source 2 controlled by the control circuit 4 and measuring means 5, e.g. in the form of a light sensitive diode for measuring an amount of radiation generated by the radiation source 2. The light sensitive diode 5 has an output coupled to the control circuit 4. The optical transmitter further has means 8 to couple the output of the radiation source 2 into a light conductor 9.

Figure 8:
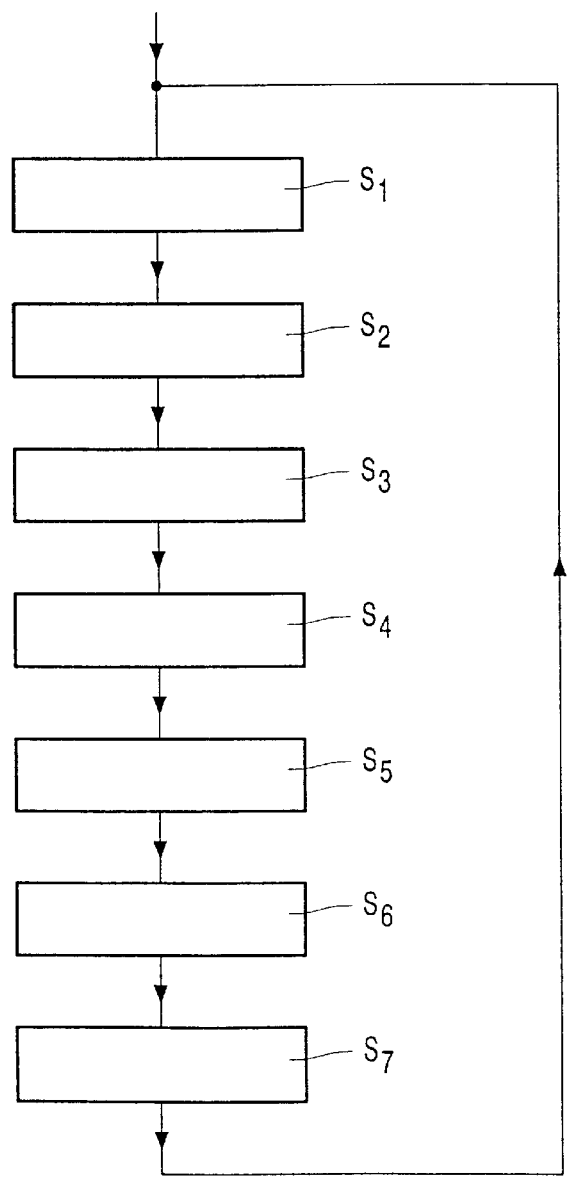
FIG. 8 schematically shows a method for controlling a radiation source.

FIG. 8 schematically shows a method for controlling a radiation source 2. The method comprises steps S1 to S3 for determining an error signal $P_{err}$. First a desired average value $P_{set}$ of the output power of the radiation source 2 is calculated in step S1. Subsequently a measured average value $P_{meas}$ of the output power of the radiation source 2 is determined in step S2. Then the difference between those values is determined in step S3. Then in steps S4 to S7 a control signal $S_{out}$ is generated for the radiation source 2 by combining said error signal $P_{err}$ and an information signal $S_{in}$ representative of information to be written to the radiation source 2. In step S4 a multiplicative factor γ is determined from the error signal Perr. Subsequently in step S5 the information signal $S_{in}$ is modified by the multiplicative factor γ. In step S6 an additive factor σ is calculated from the error signal. In step S7 the information signal $S_{in}$ is modified by the additive factor σ. The method may for example be implemented as a computer program on a general purpose processor.

It is remarked that the scope of protection of the invention is not restricted to the embodiments described herein. Neither is the scope of protection restricted by the reference numerals included in the claims. The word 'comprising' does not exclude other parts than those mentioned in a claim. The word 'a(n)' preceding an element does not exclude a plurality of those elements. The invention resides in each new feature or combination of features.

What is claimed is:

1. A control circuit for a radiation source comprising:
   means for generating an error signal ($P_{err}$) which is indicative for a difference between a measured average value ($P_{meas}$) of the output power of the radiation source and a desired average value ($P_{set}$) of the output power of the radiation source,
   combining means for combining said error signal ($P_{err}$) and an information signal ($S_{in}$) for modulating the radiation source, said combining means generating a control signal ($S_{out}$) for the radiation source in response to the combination of said error signal ($P_{err}$) and said information signal ($S_{in}$) for modulating the radiation source, wherein the combining means comprise:
   first means for modifying the information signal ($S_{in}$) by a multiplicative factor γ which is dependent on the error signal ($P_{err}$) and
   second means for modifying the information signal ($S_{in}$) by an additive factor σ which is dependent on the error signal ($P_{err}$).

2. A control circuit according to claim 1, characterized in that the multiplicative factor γ and the additive factor σ are related according to the following function:

$$\gamma = k\sigma + b,$$

wherein $$k = a\frac{\gamma_0}{\sigma_0} \text{ and } b = \gamma_0,$$

and wherein $\gamma_0$ and $\sigma_0$, respectively, are the values of γ and σ at a reference temperature.

3. A control circuit according to claim 1, characterized in that the first means comprise modification means which calculate a modified error signal (γ) from the error signal ($P_{err}$), and multiplication means for generating an intermediate signal ($\gamma S_{in}$) which is indicative of the product of the modified error signal (γ) and the information signal ($S_{in}$), and wherein the second means comprise addition means for generating an output signal ($S_{out}$) which is indicative of the sum of the intermediate signal ($\gamma S_{in}$) and the error signal ($P_{err}$), said output signal being the control signal.

4. A control circuit according to claim 3, further characterized by a node for receiving a signal ($R_{meas}$) which is indicative of a measured reflection coefficient of an object which is radiated by the radiation source, by subtraction means for generating a difference signal ($R_{diff}$) which is indicative of a difference between a desired reflection coefficient and the measured reflection coefficient, by multiplication means for generating an intermediate signal which is indicative of a product of the difference signal ($R_{diff}$) and a signal ($P_{set1}$) indicative for a desired power, and by addition means for generating a signal which is indicative of the sum of the intermediate signal and a further signal ($P_{set2}$) indicative of a desired power.

5. A control circuit according to claim 4, characterized by multiplication means for generating a product signal which is indicative of a product of the difference signal ($R_{diff}$) and the error signal ($P_{err}$), and means for generating an output signal ($\gamma$) which is indicative of the sum of the product signal and the difference signal.

6. A control circuit according to claim 1, characterized in that the first means comprise modification means which calculate a modified error signal ($\gamma$) from the error signal ($P_{err}$), and multiplication means for generating an intermediate signal ($\gamma S_{in}$) which is indicative of the product of the modified error signal ($\gamma$) and the information signal ($S_{in}$), and wherein the second means comprise further multiplication means for generating a further intermediate signal ($\sigma S_{in}$) which is indicative of a product of the error signal ($P_{err}$) and a further information signal ($S_{in}$), and addition means for generating an output signal ($S_{out}$) which is indicative for the sum of the intermediate signal ($\gamma S_{in}$) and the further intermediate signal ($\sigma Sin$), said output signal being the control signal.

7. A control circuit according to claim 1, characterized in that the first means comprise multiplication means for generating an intermediate signal ($\gamma S_{in}$) which is indicative of the product of the error signal ($P_{err}$) and the information signal ($S_{in}$), and wherein the second means comprise modification means which calculate a modified error signal ($\sigma$) from the error signal ($P_{err}$), and addition means for generating an output signal ($S_{out}$) which is indicative of the sum of the intermediate signal ($\gamma S_{in}$) and the modified error signal ($\sigma$), said output signal being the control signal.

8. A device for recording and/or playback of information on a record carrier, the device including:
   a controller as claimed in claim 1:
      a radiation source which is controllable by the controller,
      a sensor for generating a signal ($P_{meas}$) which is indicative of an intensity of radiation emitted by the radiation source and which is coupled to an input of the controller,
      means for mapping radiation emitted by the radiation source at a spot at the information carrier,
      means for causing a relative displacement between the spot and the record carrier.

9. An optical transmitter comprising:
   input means for receiving an input signal ($S_{in}$),
   a control circuit according to claim 1 coupled to said input means,
   a radiation source controlled by the control circuit,
   measuring means for measuring an amount of radiation generated by the radiation source, said measuring means having an output coupled to the control circuit,
   means to couple radiation of the radiation source into a light conductor.

10. A method for controlling a radiation source, said method comprising:
   determining an error signal ($P_{err}$) which is indicative of a difference between a measured average value ($P_{meas}$) of the output power of the radiation source and a desired average value ($P_{set}$) of the output power of the radiation source,
   generating a control signal ($S_{out}$) for the radiation source by combining said error signal ($P_{err}$) and an information signal ($S_{in}$) representative of information to be written to the radiation source, characterized in that, the step of generating the control signal comprises:
      modifying the information signal ($S_{in}$) by a multiplicative factor $\gamma$ which is dependent on the error signal ($P_{err}$), and
      modifying the information signal ($S_{in}$) by an additive factor $\sigma$ which is dependent on the error signal ($P_{err}$).

* * * * *